United States Patent
O'Halloran et al.

(10) Patent No.: US 10,866,293 B2
(45) Date of Patent: Dec. 15, 2020

(54) LOW-FIELD DIFFUSION WEIGHTED IMAGING

(71) Applicant: Hyperfine Research, Inc., Guilford, CT (US)

(72) Inventors: Rafael O'Halloran, Guilford, CT (US); Laura Sacolick, Guilford, CT (US)

(73) Assignee: Hyperfine Research, Inc., Guilford, CT (US)

( * ) Notice: Subject to any disclaimer, the term of this patent is extended or adjusted under 35 U.S.C. 154(b) by 9 days.

(21) Appl. No.: 16/527,327

(22) Filed: Jul. 31, 2019

(65) Prior Publication Data

US 2020/0041588 A1 Feb. 6, 2020

Related U.S. Application Data

(60) Provisional application No. 62/712,565, filed on Jul. 31, 2018.

(51) Int. Cl.
 *G01R 33/381* (2006.01)
 *G01R 33/389* (2006.01)
 *G01R 33/563* (2006.01)

(52) U.S. Cl.
 CPC ......... *G01R 33/381* (2013.01); *G01R 33/389* (2013.01); *G01R 33/56341* (2013.01)

(58) Field of Classification Search
 CPC ................ G01R 33/381; G01R 33/389; G01R 33/56341; G01R 33/5613; G01R 33/5615; G01R 33/445
 See application file for complete search history.

(56) References Cited

U.S. PATENT DOCUMENTS

| 4,661,775 A | 4/1987 | Kormos et al. |
| 4,885,542 A | 12/1989 | Yao et al. |

(Continued)

FOREIGN PATENT DOCUMENTS

| CN | 102414572 A | 4/2012 |
| JP | 2005-509507 A | 4/2005 |

(Continued)

OTHER PUBLICATIONS

Extended European Search Report for European Application No. 15858711.3 dated Jun. 18, 2018.

(Continued)

*Primary Examiner* — Susan S Lee
(74) *Attorney, Agent, or Firm* — Wolf, Greenfield & Sacks, P.C.

(57) ABSTRACT

Methods and apparatus for operating a low-field magnetic resonance imaging (MRI) system to perform diffusion weighted imaging, the low-field MRI system including a plurality of magnetics components including a $B_0$ magnet configured to produce a low-field main magnetic field $B_0$, at least one gradient coil configured to, when operated, provide spatial encoding of emitted magnetic resonance signals, and at least one radio frequency (RF) component configured to acquire, when operated, the emitted magnetic resonance signals. The method comprises controlling one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

20 Claims, 5 Drawing Sheets

(56) References Cited

U.S. PATENT DOCUMENTS

| | | |
|---|---|---|
| 4,978,919 A | 12/1990 | Hinks |
| 5,245,286 A | 9/1993 | Carlson et al. |
| 5,629,624 A * | 5/1997 | Carlson .............. G01R 33/38 |
| | | 324/307 |
| 5,655,533 A | 8/1997 | Petropoulos et al. |
| 5,814,987 A | 9/1998 | Smith et al. |
| 6,201,987 B1 | 3/2001 | Dumoulin |
| 6,211,677 B1 | 4/2001 | Burl et al. |
| 6,242,919 B1 | 6/2001 | Zuk et al. |
| 6,424,152 B1 | 7/2002 | Prins et al. |
| 6,445,184 B1 | 9/2002 | Tanttu |
| 6,448,773 B1 | 9/2002 | Zhang |
| 6,504,373 B2 | 1/2003 | Tsuda |
| 6,624,630 B1 | 9/2003 | Foxall |
| 7,116,105 B1 | 10/2006 | Zhang |
| 8,334,695 B2 * | 12/2012 | McColl ............ G01R 33/56509 |
| | | 324/309 |
| 8,890,527 B1 | 11/2014 | Balcom et al. |
| 9,541,616 B2 | 1/2017 | Rothberg et al. |
| 9,547,057 B2 | 1/2017 | Rearick et al. |
| 9,625,543 B2 | 4/2017 | Rearick et al. |
| 9,625,544 B2 | 4/2017 | Poole et al. |
| 9,638,773 B2 | 5/2017 | Poole et al. |
| 9,645,210 B2 | 5/2017 | McNulty et al. |
| 9,702,946 B1 | 7/2017 | Kovtunov et al. |
| 9,797,971 B2 | 10/2017 | Rearick et al. |
| 9,817,093 B2 | 11/2017 | Rothberg et al. |
| 10,139,464 B2 | 11/2018 | Rearick et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,222,435 B2 | 3/2019 | Mileski et al. |
| 10,241,177 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,295,628 B2 | 5/2019 | Mileski et al. |
| 10,310,037 B2 | 6/2019 | McNulty et al. |
| 10,324,147 B2 | 6/2019 | McNulty et al. |
| 10,330,755 B2 | 6/2019 | Poole et al. |
| 10,353,030 B2 | 7/2019 | Poole et al. |
| 10,371,773 B2 | 8/2019 | Poole et al. |
| 10,379,186 B2 | 8/2019 | Rothberg et al. |
| 10,416,264 B2 | 9/2019 | Sofka et al. |
| 10,444,310 B2 | 10/2019 | Poole et al. |
| 10,466,327 B2 | 11/2019 | Rothberg et al. |
| 10,488,482 B2 | 11/2019 | Rearick et al. |
| 10,495,712 B2 | 12/2019 | Rothberg et al. |
| 10,520,566 B2 | 12/2019 | Poole et al. |
| 10,527,692 B2 | 1/2020 | McNulty et al. |
| 10,534,058 B2 | 1/2020 | Sofka et al. |
| 10,539,637 B2 | 1/2020 | Poole et al. |
| 10,545,207 B2 | 1/2020 | Poole et al. |
| 10,551,452 B2 | 2/2020 | Rearick et al. |
| 10,564,239 B2 | 2/2020 | Poole et al. |
| 10,591,561 B2 | 3/2020 | Sacolick et al. |
| 10,709,387 B2 | 7/2020 | Poole et al. |
| 2002/0097049 A1 | 7/2002 | Goto |
| 2002/0149365 A1 | 10/2002 | DeMeester et al. |
| 2003/0160616 A1 | 8/2003 | Asano et al. |
| 2004/0021464 A1 | 2/2004 | Fahrig et al. |
| 2004/0039277 A1 | 2/2004 | Watanabe et al. |
| 2004/0164736 A1 | 8/2004 | Guthausen et al. |
| 2004/0204644 A1 | 10/2004 | Tsougarakis et al. |
| 2005/0168221 A1 | 8/2005 | Miyoshi |
| 2005/0171422 A1 | 8/2005 | Zhang |
| 2005/0270023 A1 | 12/2005 | Freedman |
| 2006/0022674 A1 | 2/2006 | Zhou et al. |
| 2006/0164082 A1 | 7/2006 | Foxall et al. |
| 2006/0255807 A1 | 11/2006 | McBride |
| 2007/0182410 A1 | 8/2007 | Niemi et al. |
| 2007/0258543 A1 | 11/2007 | Huber |
| 2008/0111547 A1 | 5/2008 | Alsop |
| 2009/0257634 A1 | 10/2009 | Moeller et al. |
| 2010/0019766 A1 | 1/2010 | Zuehlsdorff et al. |
| 2010/0045291 A1 | 2/2010 | Greiser et al. |
| 2010/0141257 A1 | 6/2010 | Graesslin et al. |
| 2010/0142785 A1 | 6/2010 | Dahnke et al. |
| 2010/0213938 A1 | 8/2010 | Jeong et al. |
| 2010/0219828 A1 | 9/2010 | Takahashi et al. |
| 2010/0237861 A1 | 9/2010 | Hennel |
| 2010/0244825 A1 | 9/2010 | Bran et al. |
| 2010/0331667 A1 | 12/2010 | Nelson |
| 2011/0190619 A1 | 8/2011 | Good |
| 2011/0257512 A1 | 10/2011 | Krueger |
| 2011/0299456 A1 | 12/2011 | Schmidt et al. |
| 2012/0010497 A1 | 1/2012 | Ehman et al. |
| 2012/0081120 A1 | 4/2012 | Elgort et al. |
| 2012/0086453 A1 | 4/2012 | Albu et al. |
| 2012/0119739 A1 | 5/2012 | Gleich |
| 2012/0223709 A1 | 9/2012 | Schillak et al. |
| 2013/0082705 A1 | 4/2013 | Landschuetz et al. |
| 2013/0214783 A1 | 8/2013 | Zhao |
| 2013/0234706 A1 | 9/2013 | Mandal et al. |
| 2013/0251227 A1 | 9/2013 | Wang et al. |
| 2013/0307538 A1 | 11/2013 | Pfeuffer et al. |
| 2014/0084929 A1 | 3/2014 | Choi et al. |
| 2014/0155732 A1 | 6/2014 | Patz et al. |
| 2014/0203804 A1 | 7/2014 | Duensing |
| 2014/0210471 A1 | 7/2014 | Stemmer |
| 2014/0218031 A1 | 8/2014 | Lee et al. |
| 2014/0225612 A1 | 8/2014 | Polimeni et al. |
| 2014/0232393 A1 | 8/2014 | Wheaton et al. |
| 2014/0232400 A1 | 8/2014 | Kim et al. |
| 2014/0266195 A1 | 9/2014 | Levin |
| 2014/0343397 A1 | 11/2014 | Kim et al. |
| 2015/0115960 A1 | 4/2015 | Grodzki |
| 2016/0069968 A1 | 3/2016 | Rothberg et al. |
| 2016/0069970 A1 | 3/2016 | Rearick et al. |
| 2016/0069971 A1 | 3/2016 | McNulty et al. |
| 2016/0069972 A1 | 3/2016 | Poole et al. |
| 2016/0069975 A1 | 3/2016 | Rothberg et al. |
| 2016/0128592 A1 | 5/2016 | Rosen et al. |
| 2016/0131727 A1 | 5/2016 | Sacolick et al. |
| 2016/0169992 A1 | 6/2016 | Rothberg et al. |
| 2016/0169993 A1 | 6/2016 | Rearick et al. |
| 2016/0192859 A1 | 7/2016 | Shirai et al. |
| 2016/0223631 A1 | 8/2016 | Poole et al. |
| 2016/0231399 A1 | 8/2016 | Rothberg et al. |
| 2016/0231402 A1 | 8/2016 | Rothberg et al. |
| 2016/0231403 A1 | 8/2016 | Rothberg et al. |
| 2016/0231404 A1 | 8/2016 | Rothberg et al. |
| 2016/0299203 A1 | 10/2016 | Mileski et al. |
| 2016/0334479 A1 | 11/2016 | Poole et al. |
| 2017/0003363 A1 | 1/2017 | Rosen et al. |
| 2017/0010339 A1 | 1/2017 | Rosen et al. |
| 2017/0102443 A1 | 4/2017 | Rearick et al. |
| 2017/0227616 A1 | 8/2017 | Poole et al. |
| 2017/0276747 A1 | 9/2017 | Hugon et al. |
| 2017/0276749 A1 | 9/2017 | Hugon et al. |
| 2017/0276751 A1 | 9/2017 | Xie et al. |
| 2018/0024208 A1 | 1/2018 | Rothberg et al. |
| 2018/0038931 A1 | 2/2018 | Rearick et al. |
| 2018/0088193 A1 | 3/2018 | Rearick et al. |
| 2018/0143274 A1 | 5/2018 | Poole et al. |
| 2018/0143275 A1 | 5/2018 | Sofka et al. |
| 2018/0143280 A1 | 5/2018 | Dyvorne et al. |
| 2018/0143281 A1 | 5/2018 | Sofka et al. |
| 2018/0144467 A1 | 5/2018 | Sofka et al. |
| 2018/0156881 A1 | 6/2018 | Poole et al. |
| 2018/0164390 A1 | 6/2018 | Poole et al. |
| 2018/0168527 A1 | 6/2018 | Poole et al. |
| 2018/0210047 A1 | 7/2018 | Poole et al. |
| 2018/0224512 A1 | 8/2018 | Poole et al. |
| 2018/0238978 A1 | 8/2018 | McNulty et al. |
| 2018/0238980 A1 | 8/2018 | Poole et al. |
| 2018/0238981 A1 | 8/2018 | Poole et al. |
| 2019/0004130 A1 | 1/2019 | Poole et al. |
| 2019/0011510 A1 | 1/2019 | Hugon et al. |
| 2019/0011513 A1 | 1/2019 | Poole et al. |
| 2019/0011514 A1 | 1/2019 | Poole et al. |
| 2019/0011521 A1 | 1/2019 | Sofka et al. |
| 2019/0018094 A1 | 1/2019 | Mileski et al. |
| 2019/0018095 A1 | 1/2019 | Mileski et al. |

(56) References Cited

U.S. PATENT DOCUMENTS

| | | |
|---|---|---|
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0038233 A1 | 2/2019 | Poole et al. |
| 2019/0086497 A1 | 3/2019 | Rearick et al. |
| 2019/0101607 A1 | 4/2019 | Rothberg et al. |
| 2019/0162806 A1 | 5/2019 | Poole et al. |
| 2019/0178962 A1 | 6/2019 | Poole et al. |
| 2019/0178963 A1 | 6/2019 | Poole et al. |
| 2019/0227136 A1 | 7/2019 | Mileski et al. |
| 2019/0227137 A1 | 7/2019 | Mileski et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0200844 A1 | 6/2020 | Boskamp et al. |
| 2020/0209334 A1 | 7/2020 | O'Halloran et al. |

FOREIGN PATENT DOCUMENTS

| | | |
|---|---|---|
| JP | 2005-524453 A | 8/2005 |
| JP | 2006-280930 A | 10/2006 |
| JP | 2014-121384 A | 7/2014 |

OTHER PUBLICATIONS

International Search Report and Written Opinion for Application No. PCT/US2019/044262, dated Nov. 11, 2019.
Invitation to Pay Additional Fees mailed Jan. 7, 2016 in connection with International Application No. PCT/US2015/060177.
International Search Report and Written Opinion dated Feb. 25, 2016 in connection with International Application No. PCT/US2015/060117.
Blanco et al., Interventional and intraoperative MRI at low field scanner—a review. European Journal of Radiology, Elsevier Science. 2005;56(2): 130-42.
Block et al., Undersampled Radial MRI with Multiple Coils. Iterative Image Reconstruction Using a Total Variation Constraint. Magnetic Resonance in Medicine. 2007;57:1086-98.
Buonocore et al., Ghost artifact reduction for echo planar imaging using image phase correction. Magnetic resonance in medicine. Jul. 1997;38(1):89-100.
Gao et al., Distortion-free diffusion MRI using an MRI-guided Tri-Cobalt 60 radiotherapy system: sequence verification and preliminary clinical experience. Medical physics. Oct. 2017;44(10):5357-66.
Grodzki et al., Quiet TI-weighted head scanning using PETRA. Proc. Intl. Soc. Mag. Reson. Med. 2013;21:0456.
Grodzki, Entwicklung von neuen Sequenzen mit ultrakurzen Echozeiten für die klinische Magnetresonanzbildgebung. 2011. 109 pages.
Haacke et al., Susceptibility-Weighted Imaging: Technical Aspects and Clinical Applications, Part 1. AJNR Am J Neuroradiol. 2009;30:19-30.
Jackson et al., Selection of a Convolution Function for Fourier Inversion Using Gridding. IEEE Transactions on Medical Imaging. 1991;10(3):473-8.
Li et al., Correction of Excitation Profile in Zero Echo Time (ZTE) Imaging Using Quadratic Phase-Modulated RF Pulse Excitation and Iterative Reconstruction. IEEE Trans Med Imaging. Apr. 2014; 33(4):961-9. retrieved on Feb. 10, 2016: http://www.ncbi.nlm.nih.gov/pmc/articles/PMC4136480.
Weiger et al., MRI with Zero Echo Time: Hard Versus Sweep Pulse Excitation. Magnetic Resonance in Medicine. 2011;66:379-89.
Wu et al., Water- and Fat-Suppressed Proton Projection MRI (WASPI) of Rat Femur Bone. Magnetic Resonance in Medicine 2007;57:554-67.
U.S. Appl. No. 16/806,532, filed Mar. 2, 2020, Sacolick et al.
U.S. Appl. No. 14/938,430, filed Nov. 11, 2015, Sacolick et al.
EP 15858711.3, Jun. 18, 2018, Extended European Search Report.
PCT/US2015/060117, Feb. 25, 2016, International Search Report and Written Opinion.
PCT/US2015/060177, Jan. 7, 2016, Invitation to Pay Additional Fees.
PCT/US2019/044262, Nov. 11, 2019, International Search Report and Written Opinion.

\* cited by examiner

LOW-FIELD DIFFUSION WEIGHTED IMAGING

RELATED APPLICATIONS

This application claims priority under 35 U.S.C. § 119(e) to U.S. Provisional Application No. 62/712,565, filed Jul. 31, 2018 and titled, "LOW-FIELD DIFFUSION WEIGHTED IMAGING," the entire contents of which is incorporated by reference herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Some embodiments are directed to a low-field magnetic resonance imaging (MRI) system. The low-field MRI system comprises a plurality of magnetics components including a $B_0$ magnet configured to produce a low-field main magnetic field $B_0$, at least one gradient coil configured to, when operated, provide spatial encoding of emitted magnetic resonance signals, at least one radio frequency (RF) component configured to acquire, when operated, the emitted magnetic resonance signals, and at least one controller. The at least one controller is configured to operate one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

Some embodiments are directed to a computer-implemented method of operating a low-field magnetic resonance imaging (MRI) system to perform diffusion weighted imaging, the low-field MRI system including a plurality of magnetics components including a $B_0$ magnet configured to produce a low-field main magnetic field $B_0$, at least one gradient coil configured to, when operated, provide spatial encoding of emitted magnetic resonance signals, and at least one radio frequency (RF) component configured to acquire, when operated, the emitted magnetic resonance signals. The method comprising controlling one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

Some embodiments are directed to a non-transitory computer-readable medium encoded with a plurality of instructions that, when executed by at least one computer processor, cause the at least one computer processor to perform a method of operating a low-field magnetic resonance imaging (MRI) system to perform diffusion weighted imaging, the low-field MRI system including a plurality of magnetics components including a $B_0$ magnet configured to produce a low-field main magnetic field $B_0$, at least one gradient coil configured to, when operated, provide spatial encoding of emitted magnetic resonance signals, and at least one radio frequency (RF) component configured to acquire, when operated, the emitted magnetic resonance signals. The method comprises controlling one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

Various non-limiting embodiments of the technology will be described with reference to the following figures. It should be appreciated that the figures are not necessarily drawn to scale.

DETAILED DESCRIPTION

Figure 1:
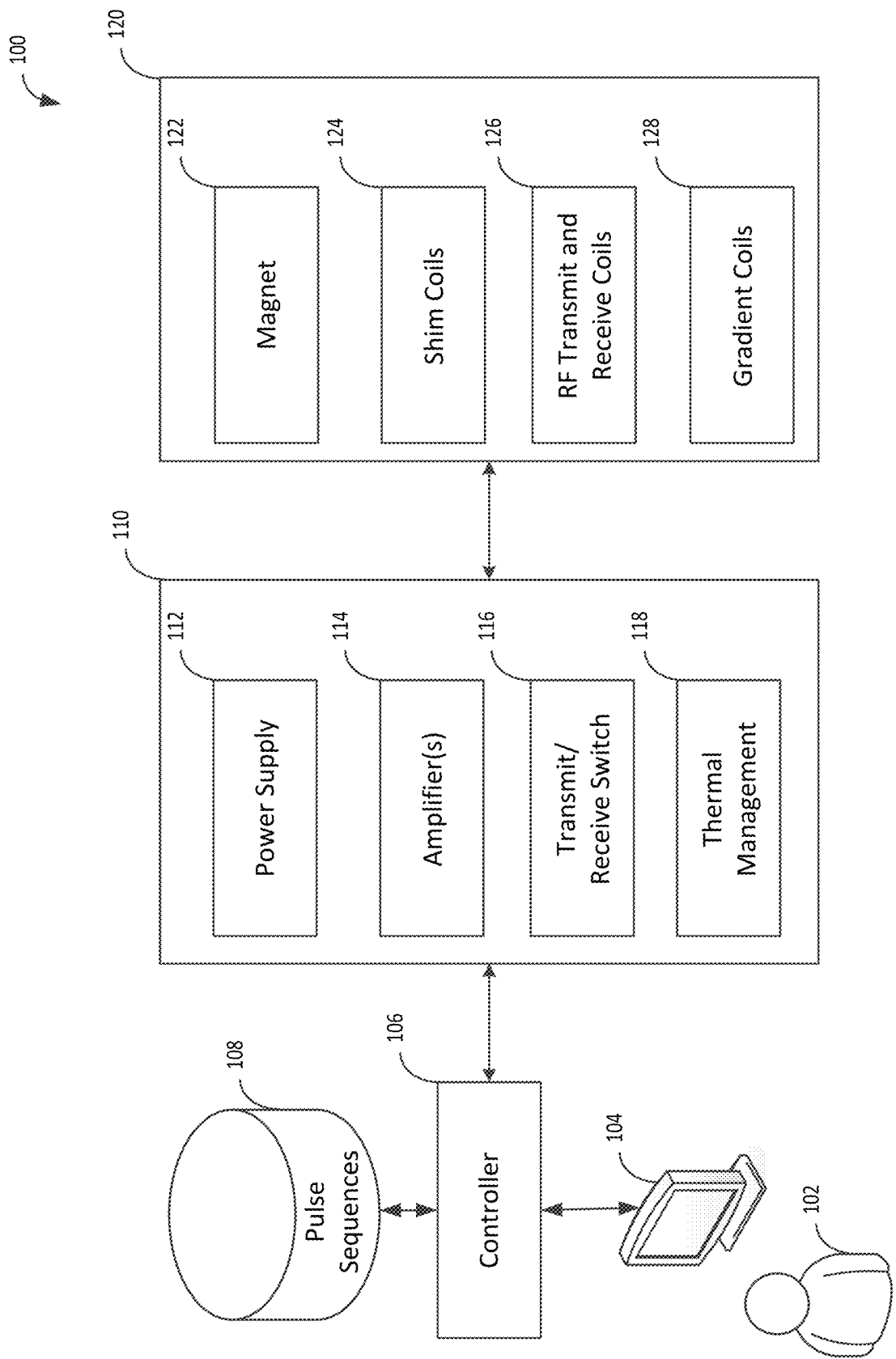
FIG. 1 illustrates exemplary components of a low-field magnetic resonance imaging system that may be controlled to perform diffusion-weighted imaging in accordance with some embodiments.

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

As discussed above, conventional MRI systems require specialized facilities. An electromagnetically shielded room is required for the MRI system to operate and the floor of the room must be structurally reinforced. Additional rooms must be provided for the high-power electronics and the scan technician's control area. Secure access to the site must also be provided. In addition, a dedicated three-phase electrical connection must be installed to provide the power for the electronics that, in turn, are cooled by a chilled water supply. Additional HVAC capacity typically must also be provided. These site requirements are not only costly, but significantly limit the locations where MRI systems can be deployed. Conventional clinical MRI scanners also require substantial expertise to both operate and maintain. These highly trained technicians and service engineers add large on-going operational costs to operating an MRI system. Conventional MRI, as a result, is frequently cost prohibitive and is severely limited in accessibility, preventing MRI from being a widely available diagnostic tool capable of delivering a wide range of clinical imaging solutions wherever and whenever needed. Typically, a patient must visit one of a limited number of facilities at a time and place scheduled in advance, preventing MRI from being used in numerous medical applications for which it is uniquely efficacious in assisting with diagnosis, surgery, patient monitoring and the like.

As discussed above, high-field MRI systems require specially adapted facilities to accommodate the size, weight, power consumption and shielding requirements of these systems. For example, a 1.5 T MRI system typically weighs between 4-10 tons and a 3 T MRI system typically weighs between 8-20 tons. In addition, high-field MRI systems generally require significant amounts of heavy and expensive shielding. Many mid-field scanners are even heavier, weighing between 10-20 tons due, in part, to the use of very large permanent magnets and/or yokes. Commercially available low-field MRI systems (e.g., operating with a $B_0$ magnetic field of 0.2 T) are also typically in the range of 10 tons or more due the large of amounts of ferromagnetic material used to generate the $B_0$ field, with additional tonnage in shielding. To accommodate this heavy equipment, rooms (which typically have a minimum size of 30-50 square meters) have to be built with reinforced flooring (e.g., concrete flooring), and must be specially shielded to prevent electromagnetic radiation from interfering with operation of the MRI system. Thus, available clinical MRI systems are immobile and require the significant expense of a large, dedicated space within a hospital or facility, and in addition to the considerable costs of preparing the space for operation, require further additional on-going costs in expertise in operating and maintaining the system.

In addition, currently available MRI systems typically consume large amounts of power. For example, common 1.5 T and 3 T MRI systems typically consume between 20-40 kW of power during operation, while available 0.5 T and 0.2 T MRI systems commonly consume between 5-20 kW, each using dedicated and specialized power sources. Unless otherwise specified, power consumption is referenced as average power consumed over an interval of interest. For example, the 20-40 kW referred to above indicates the average power consumed by conventional MRI systems during the course of image acquisition, which may include relatively short periods of peak power consumption that significantly exceeds the average power consumption (e.g., when the gradient coils and/or RF coils are pulsed over relatively short periods of the pulse sequence). Intervals of peak (or large) power consumption are typically addressed via power storage elements (e.g., capacitors) of the MRI system itself. Thus, the average power consumption is the more relevant number as it generally determines the type of power connection needed to operate the device. As discussed above, available clinical MRI systems must have dedicated power sources, typically requiring a dedicated three-phase connection to the grid to power the components of the MRI system. Additional electronics are then needed to convert the three-phase power into single-phase power utilized by the MRI system. The many physical requirements of deploying conventional clinical MRI systems creates a significant problem of availability and severely restricts the clinical applications for which MRI can be utilized.

Accordingly, the many requirements of high-field MRI render installations prohibitive in many situations, limiting their deployment to large institutional hospitals or specialized facilities and generally restricting their use to tightly scheduled appointments, requiring the patient to visit dedicated facilities at times scheduled in advance. Thus, the many restrictions on high-field MRI prevent MRI from being fully utilized as an imaging modality. Despite the drawbacks of high-field MRI mentioned above, the appeal of the significant increase in signal-to-noise ratio (SNR) at higher fields continues to drive the industry to higher and higher field strengths for use in clinical and medical MRI applications, further increasing the cost and complexity of MRI scanners, and further limiting their availability and preventing their use as a general-purpose and/or generally-available imaging solution.

The low SNR of MR signals produced in the low-field regime (particularly in the very low-field regime) has prevented the development of a relatively low cost, low power and/or portable MRI system. Conventional "low-field" MRI systems operate at the high end of what is typically characterized as the low-field range (e.g., clinically available low-field systems have a floor of approximately 0.2 T) to achieve useful images. Though somewhat less expensive then high-field MRI systems, conventional low-field MRI systems share many of the same drawbacks. In particular, conventional low-field MRI systems are large, fixed and immobile installments, consume substantial power (requiring dedicated three-phase power hook-ups) and require specially shielded rooms and large dedicated spaces. The challenges of low-field MRI have prevented the development of relatively low cost, low power and/or portable MRI systems that can produce useful images.

The inventors have developed techniques enabling portable, low-field, low power and/or lower-cost MRI systems that can improve the wide-scale deployability of MRI technology in a variety of environments beyond the current MRI installments at hospitals and research facilities. As a result, MRI can be deployed in emergency rooms, small clinics, doctor's offices, in mobile units, in the field, etc. and may be brought to the patient (e.g., bedside) to perform a wide variety of imaging procedures and protocols. Some embodiments include very low-field MRI systems (e.g., 0.1 T, 50 mT, 20 mT, etc.) that facilitate portable, low-cost, low-power MRI, significantly increasing the availability of MRI in a clinical setting.

There are numerous challenges to developing a clinical MRI system in the low-field regime. As used herein, the term clinical MRI system refers to an MRI system that produces clinically useful images, which refers to images having sufficient resolution and adequate acquisition times to be useful to a physician or clinician for its intended purpose given a particular imaging application. As such, the resolutions/acquisition times of clinically useful images will depend on the purpose for which the images are being obtained. Among the numerous challenges in obtaining clinically useful images in the low-field regime is the relatively low SNR. Specifically, the relationship between SNR and $B_0$ field strength is approximately $B_0^{5/4}$ at field strength above 0.2 T and approximately $B_0^{3/2}$ at field strengths below 0.1 T. As such, the SNR drops substantially with decreases in field strength with even more significant drops in SNR experienced at very low field strength. This substantial drop in SNR resulting from reducing the field strength is a significant factor that has prevented development of clinical MRI systems in the very low-field regime. In particular, the challenge of the low SNR at very low field strengths has prevented the development of a clinical MRI system operating in the very low-field regime. As a result, clinical MRI systems that seek to operate at lower field strengths have conventionally achieved field strengths of approximately the 0.2 T range and above. These MRI systems are still large, heavy and costly, generally requiring fixed dedicated spaces (or shielded tents) and dedicated power sources.

The inventors have developed low-field and very low-field MRI systems capable of producing clinically useful images, allowing for the development of portable, low cost and easy to use MRI systems not achievable using state of the art technology. According to some embodiments, an MRI system can be transported to the patient to provide a wide variety of diagnostic, surgical, monitoring and/or therapeutic procedures, generally, whenever and wherever needed.

FIG. 1 is a block diagram of typical components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that a MRI system may have one or more other components of any suitable type in addition to or instead of the components illustrated in FIG. 1. However, a MRI system will generally include these high level components, though the implementation of these components for a particular MRI system may differ vastly, as discussed in further detail below.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field. As discussed above, in the high field regime, the $B_0$ magnet is typically formed using superconducting material generally provided in a solenoid geometry, requiring cryogenic cooling systems to keep the $B_0$ magnet in a superconducting state. Thus, high-field $B_0$ magnets are expensive, complicated and consume large amounts of power (e.g., cryogenic cooling systems require significant power to maintain the extremely low temperatures needed to keep the $B_0$ magnet in a superconducting state), require large dedicated spaces, and specialized, dedicated power connections (e.g., a dedicated three-phase power connection to the power grid). Conventional low-field $B_0$ magnets (e.g., $B_0$ magnets operating at 0.2 T) are also often implemented using superconducting material and therefore have these same general requirements. Other conventional low-field $B_0$ magnets are implemented using permanent magnets, which to produce the field strengths to which conventional low-field systems are limited (e.g., between 0.2 T and 0.3 T due to the inability to acquire useful images at lower field strengths), need to be very large magnets weighing 5-20 tons. Thus, the $B_0$ magnet of conventional MRI systems alone prevents both portability and affordability.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications. As discussed above, conventional gradient coils also consume significant power, typically operated by large, expensive gradient power sources, as discussed in further detail below.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses.

Power management system 110 includes electronics to provide operating power to one or more components of the low-field MRI system 100. For example, as discussed in more detail below, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

In conventional MRI systems, the power components are large, expensive and consume significant power. Typically, the power electronics occupy a room separate from the MRI scanner itself. The power electronics not only require substantial space, but are expensive complex devices that consume substantial power and require wall mounted racks to be supported. Thus, the power electronics of conventional MRI systems also prevent portability and affordable of MRI.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information. In conventional MRI systems, computing device 104 typically includes one or more high performance work-stations configured to perform computationally expensive processing on MR data relatively rapidly. Such computing devices are relatively expensive equipment on their own.

As should be appreciated from the foregoing, currently available clinical MRI systems (including high-field, mid-field and low-field systems) are large, expensive, fixed installations requiring substantial dedicated and specially designed spaces, as well as dedicated power connections. The inventors have developed low-field, including very-low field, MRI systems that are lower cost, lower power and/or portable, significantly increasing the availability and applicability of MRI. According to some embodiments, a portable MRI system is provided, allowing an MRI system to be brought to the patient and utilized at locations where it is needed.

As discussed above, some embodiments include an MRI system that is portable, allowing the MRI device to be moved to locations in which it is needed (e.g., emergency and operating rooms, primary care offices, neonatal intensive care units, specialty departments, emergency and mobile transport vehicles and in the field). There are numerous challenges that face the development of a portable MRI system, including size, weight, power consumption and the ability to operate in relatively uncontrolled electromagnetic noise environments (e.g., outside a specially shielded room).

An aspect of portability involves the capability of operating the MRI system in a wide variety of locations and environments. As discussed above, currently available clinical MRI scanners are required to be located in specially shielded rooms to allow for correct operation of the device and is one (among many) of the reasons contributing to the cost, lack of availability and non-portability of currently available clinical MRI scanners. Thus, to operate outside of a specially shielded room and, more particularly, to allow for generally portable, cartable or otherwise transportable MRI, the MRI system must be capable of operation in a variety of noise environments. The inventors have developed noise suppression techniques that allow the MRI system to be operated outside of specially shielded rooms, facilitating both portable/transportable MRI as well as fixed MRI installments that do not require specially shielded rooms. While the noise suppression techniques allow for operation outside specially shielded rooms, these techniques can also be used to perform noise suppression in shielded environments, for example, less expensive, loosely or ad-hoc shielding environments, and can be therefore used in conjunction with an area that has been fitted with limited shielding, as the aspects are not limited in this respect.

A further aspect of portability involves the power consumption of the MRI system. As also discussed above, current clinical MRI systems consume large amounts of power (e.g., ranging from 20 kW to 40 kW average power consumption during operation), thus requiring dedicated power connections (e.g., dedicated three-phase power connections to the grid capable of delivering the required power). The requirement of a dedicated power connection is a further obstacle to operating an MRI system in a variety of locations other than expensive dedicated rooms specially fitted with the appropriate power connections. The inventors have developed low power MRI systems capable of operating using mains electricity such as a standard wall outlet (e.g., 120V/20 A connection in the U.S.) or common large appliance outlets (e.g., 220-240V/30 A), allowing the device to be operated anywhere common power outlets are provided. The ability to "plug into the wall" facilitates both portable/transportable MRI as well as fixed MRI system installations without requiring special, dedicated power such as a three-phase power connection.

Low-field MR has been explored in limited contexts for non-imaging research purposes and narrow and specific contrast-enhanced imaging applications, but is conventionally regarded as being unsuitable for producing clinically useful images. For example, the resolution, contrast, and/or image acquisition time is generally not regarded as being suitable for clinical purposes including, but not limited to, tissue differentiation, blood flow or perfusion imaging, diffusion-weighted (DW) or diffusion tensor (DT) imaging, functional MRI (fMRI), etc. At least some of the difficulty in obtaining clinically useful images using low-field MRI relates to the fact that, generally speaking, pulse sequences designed for high-field MRI are unsuitable in a low-field environment.

The inventors have developed a technique for performing diffusion-weighted imaging in the low-field environment. Currently, diffusion-weighted imaging (DWI) is the only MRI contrast that can directly assess tissue microstructure, which is important for diagnosing stroke and other pathology. Performing DWI is technically challenging in that DWI is an inherently low-SNR sequence and places high demands on MRI hardware including the gradient coils and amplifiers. Low-cost, low-field MR scanners amplify the technical challenges of implementing DWI. One example of a low-cost, low-field MR scanner is described in U.S. Pat. App. Pub. No. 2018/0164390, titled "Electromagnetic Shielding for Magnetic Resonance Imaging Methods and Apparatus," which is incorporated by reference herein in its entirety.

To at least partially address some of the challenges of performing DWI at low field, the inventors have developed a pulse sequence referred to herein as the diffusion-weighted steady state free precession (DW-SSFP) sequence, that is specifically designed for use and/or optimal performance in the low-field context. For example, the DW-SSFP sequence has higher SNR efficiency and lower demands on gradient amplifiers than conventional DWI sequences. The inventors have developed several innovations to enable a low-field MR scanner to perform the DW-SSFP sequence including, but not limited to, the ones described below.

Figure 2:
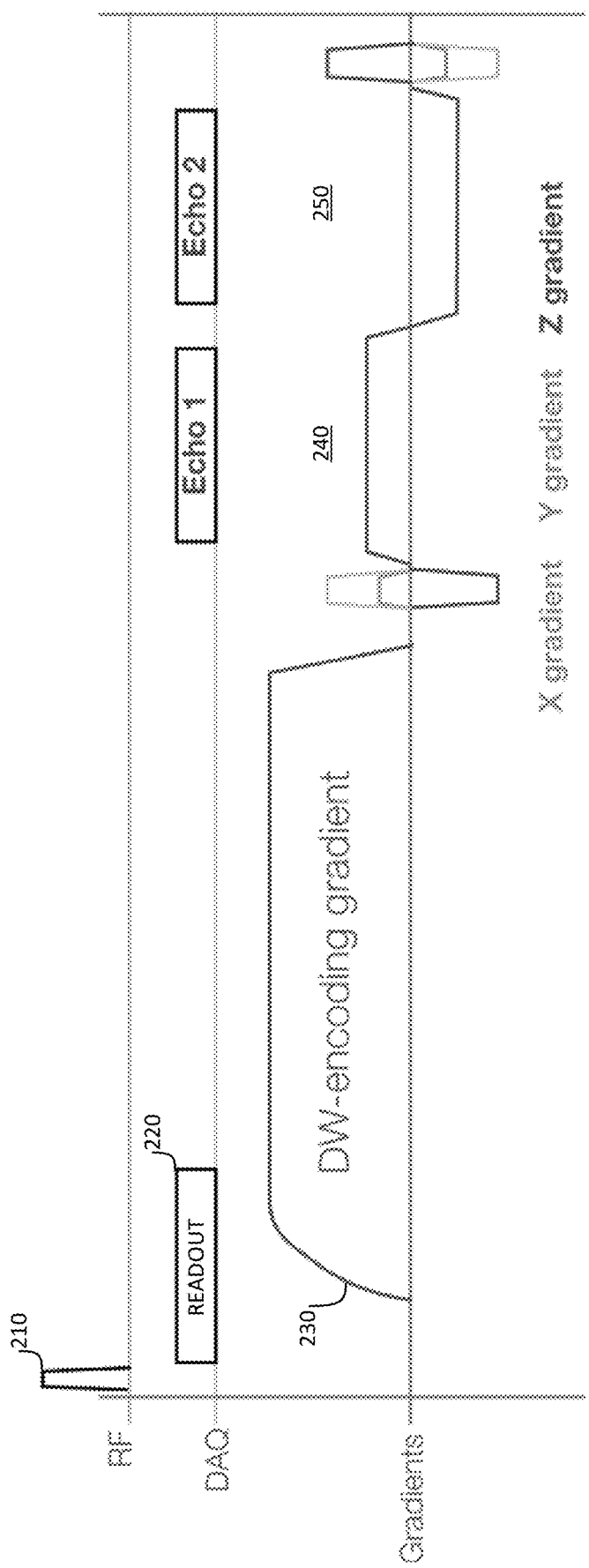
FIG. 2 illustrates a pulse sequence that may be used to perform diffusion-weighted imaging using a low-field magnetic resonance imaging system in accordance with some embodiments.

FIG. 2 schematically illustrates a time-sequence of aspects of the DW-SSFP sequence in accordance with some embodiments. In particular, FIG. 2 illustrates a radio-frequency (RF) time sequence indicating times when the RF coil is transmitting an RF pulse (e.g., RF pulse 210), a data acquisition (DAQ) time sequence indicating times when emitted magnetic resonance signals are being acquired by the MR receive coils, and a gradient time sequence indicating times when the x-, y-, and z-gradients are activated to provide spatial encoding of the emitted MR signals.

Conventional DWI sequences place large demands on gradient amplifiers and coils. The gradient coils warm up with use and the heat generated by the gradient coils is transferred to their surroundings, including the magnet blocks that generate the main $B_0$ field in the low-field MR scanner. Consequently, the $B_0$ field produced by the magnet blocks lowers as a result of heating from excessive gradient coil use in conventional DWI sequences. Changes in the generated $B_0$ field due to heating cause the reconstructed image to shift along the readout direction, resulting in blurring along that direction. To at least partially mitigate the heating-induced field drift of the $B_0$ magnet, the DW-SSFP sequence includes an RF pulse 210 immediately followed by a readout period 220 during which magnetic resonance data is acquired, as shown in FIG. 2.

Figure 3:
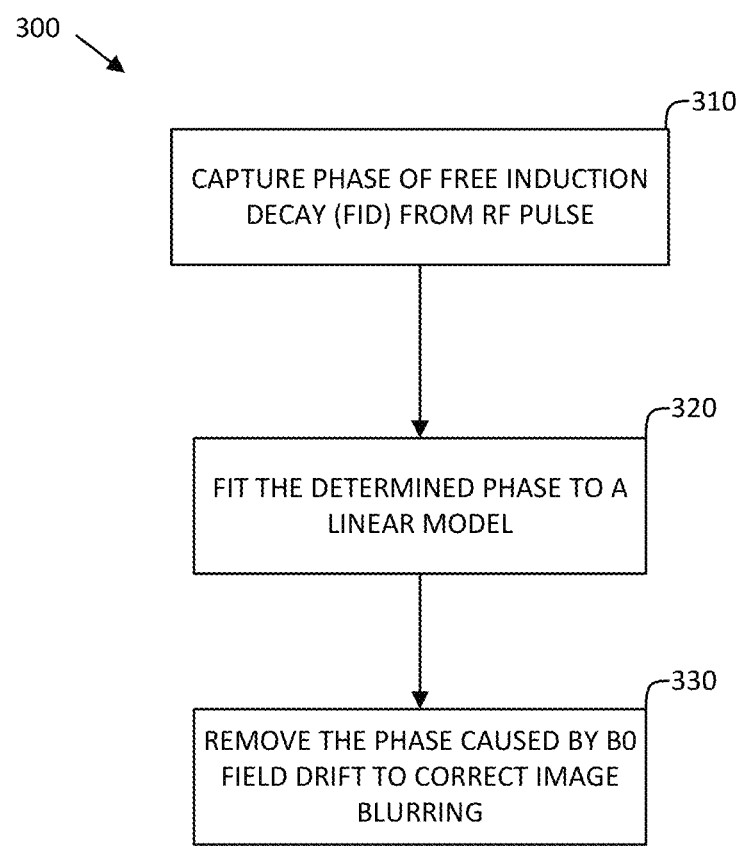
FIG. 3 illustrates a process for correcting image blurring caused during diffusion-weighted imaging using a low-field magnetic resonance imaging system in accordance with some embodiments.

FIG. 3 illustrates a process 300 for using magnetic resonance data acquired during the readout period 220 immediately following the RF pulse 210 to correct image blurring due to $B_0$ field drift. In act 310, the phase of the free induction decay (FID) resulting from the RF pulse is captured during readout period 220. The slope of the phase of the FID is directly proportional to the $B_0$ field strength. Process 300 then proceeds to act 320, where the phase of the FID determined in act 310 is fit to a linear model to improve robustness to noise due to $B_0$ field drift. Process 300 then proceeds to act 330, where the fit phase is used to remove the phase introduced into the acquired MR signals caused by $B_0$ field drift, thereby correcting the blurring in the resulting images.

Some low-field MR scanners, such as the low-field scanner described in U.S. Pat. App. Pub. No. 2018/0164390, include gradient components that produce lower gradient amplitudes than a conventional high-field MRI system. However, as discussed above, diffusion weighted imaging requires a substantial amount of gradient encoding. To reduce encoding time, it is desirable to use the maximum amplitude gradient possible. However, eddy current pre-emphasis, which is used for image correction, requires extra room above the maximum gradient amplitude of any gradient encoding waveform to perform pre-emphasis. Accordingly, trapezoidal waveforms for DW gradient encoding are generally prevented from using the maximum gradient due to the need to leave room for the eddy current pre-emphasis above the maximum. To balance the desire to use maximum amplitude gradients and the need to include eddy current pre-emphasis, some embodiments of the DW-SSFP pulse sequence include a diffusion weighted encoding gradient waveform that is not trapezoidal. An example, of such a waveform is shown in FIG. 2 and includes a shaped attack edge 230. As shown, the shaped attack edge does not have a constant slope, but rather has a slope that decreases as the maximum value is approached. The shaped attack edge ensures that the pre-emphasized resulting waveform has a flat top at the maximum. As shown, the decay edge of diffusion-weighted encoding gradient waveform is unaffected, such that pre-emphasis can be used to reduce the resulting eddy currents during the imaging block (corresponding to the time periods 240 and 250 in FIG. 2).

As discussed above, low-field MRI systems by their design have lower SNR compared to high-field MRI systems. As shown in FIG. 2, the diffusion weighted encoding gradients occur over a relatively long timespan and as such, the available signal to be detected is reduced. To increase SNR efficiency, it is desired that the readout time following diffusion-weighted gradient encoding (also referred to herein as the "imaging block") be as long as possible. However, the inhomogeneity of the $B_0$ field in some low-field scanners may cause longer readouts to have blurring and image warping. As shown in FIG. 2, in some embodiments, the DW-SSFP sequence extends the imaging block by encoding multiple echoes during time periods 240 and 250 in the imaging block. Although two echoes are shown in FIG. 2, it should be appreciated that any number of echoes may alternatively be used in the DW-SSFP sequence in accordance with some embodiments. In a readout scheme with multiple encoded echoes, as shown, a line of k-space is measured during a first time period 240, the gradient polarity is reversed, and the same line of k-space is measured again during a second time period 250. Such a readout scheme reduces encoding time and increases SNR efficiency.

The gradients used in DWI sequences are typically large, resulting in residual eddy currents in the magnetic components of the low-field MRI system. The residual eddy currents cause warping of the image along the slowest encoding direction. Warping also arises from the inhomogeneous $B_0$ field, as noted above. In the multi-echo approach, an example of which is shown in FIG. 2, the warping is in opposite directions for adjacent echoes in the pulse sequence (e.g., the echo encoded during time period 240 and the echo encoded during time period 250 have opposite gradient polarities). By comparing the adjacent echoes having opposite gradient polarities, the images can de-warped during image reconstruction and the images can be combined to increase SNR.

Figure 4:
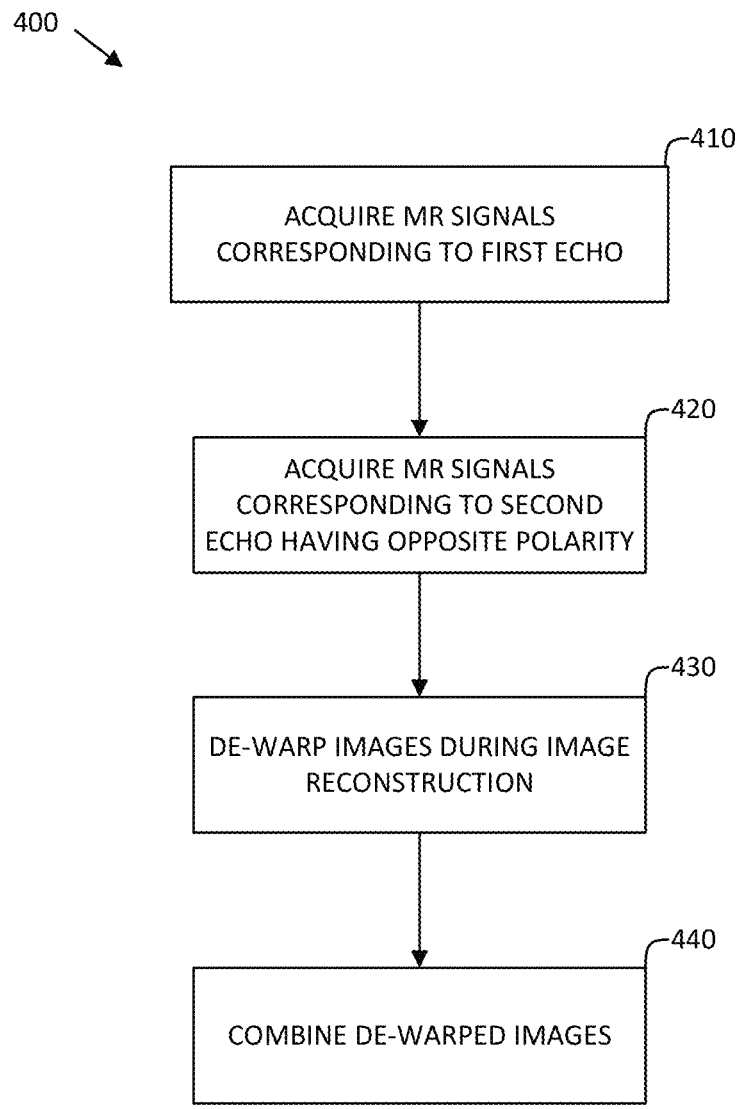
FIG. 4 illustrates a process for improving image quality by using multiple echo periods in a diffusion-weighted imaging pulse sequence in accordance with some embodiments.
Figures 5A, 5B, 5C:
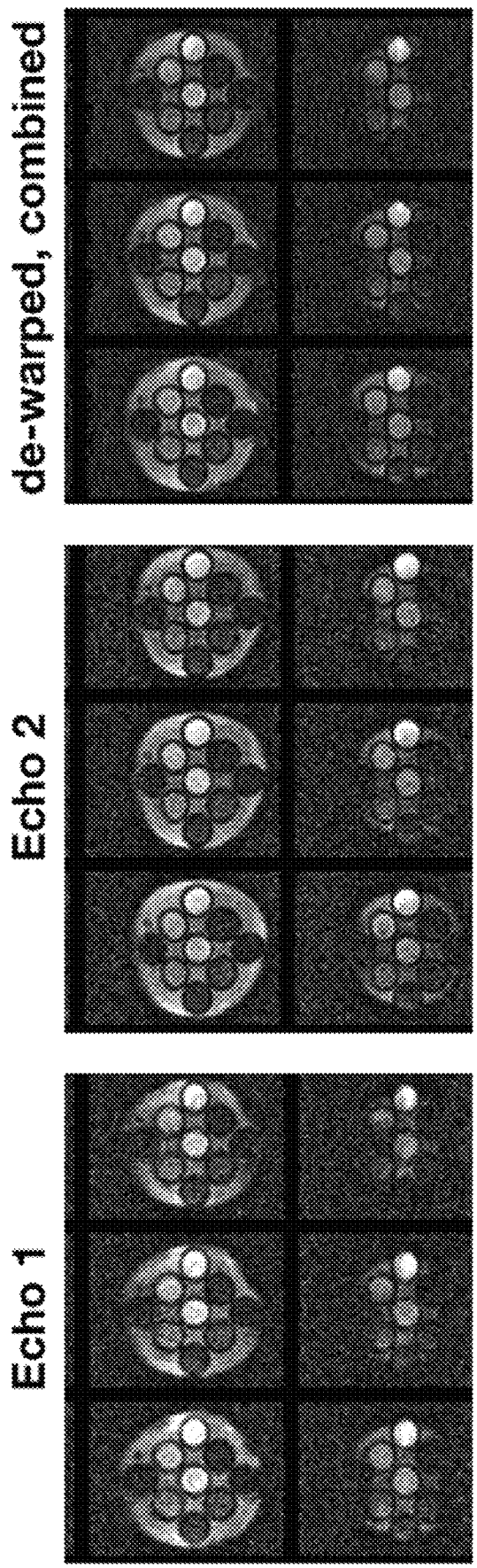
FIGS. 5A-C illustrate images generated using the process shown in FIG. 4.

FIG. 4 illustrates a process 400 for increasing SNR for diffusion weighted imaging using a pulse sequence with multiple echoes having different polarities in accordance with some embodiments. In act 410, MR signals corresponding to a first gradient echo of the DW-SSFP pulse sequence (e.g., the echo encoded during time period 240) are acquired. FIG. 5A shows images reconstructed based on the MR signals acquired during time period 240. Process 400 then proceeds to act 420, where MR signals corresponding to a second gradient echo of the DW-SSFP pulse sequence (e.g., the echo encoded during time period 250) are acquired. FIG. 5B shows images reconstructed based on the MR signals acquired during the time period 250. Process 400 then proceeds to act 430 where the images acquired during time period 240 and the images acquired during time period 250 are de-warped during image reconstruction. Process 400 then proceeds to act 440 where the de-warped images are combined. FIG. 4C shows images obtained by de-warping the images from FIGS. 4A-B and combining the images to increase SNR in accordance with some embodiments.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-discussed function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. A low-field magnetic resonance imaging (MRI) system, comprising:
    a plurality of magnetics components including:
        a $B_0$ magnet configured to produce a low-field main magnetic field $B_0$;
        at least one gradient coil configured to, when operated, provide spatial encoding of emitted magnetic resonance signals;
        at least one radio frequency (RF) component configured to acquire, when operated, the emitted magnetic resonance signals; and
    at least one controller configured to operate one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

2. The low-field MRI system of claim 1, wherein the at least one controller is further configured to reconstruct at least one image based, at, least in part, on the magnetic resonance signals detected during each of the multiple echo periods.

3. The low-field MRI system of claim 2, wherein the multiple echo periods includes a first echo period during which a first encoded echo has a first gradient polarity and a second echo period immediately following the first echo period during which a second encoded echo has a second encoded echo having a second gradient polarity opposite the first gradient polarity.

4. The low-field MRI system of claim 3, wherein reconstructing the at least one image comprises:

reconstructing a first plurality of images based, at least in part, on the magnetic resonance signals detected during the first echo period;

reconstructing a second plurality of images based, at least in part, on the magnetic signals detected during the second echo period;

de-warping the first plurality of images and the second plurality of images; and combining the de-warped first plurality of images and the second plurality of images to reconstruct the at least one image.

5. The low-field MRI system of claim 2, wherein the at least one pulse sequence further comprises an RF pulse followed by a readout period, wherein the readout period overlaps in time with the diffusion-weighted gradient encoding period.

6. The low-field MRI system of claim 5, wherein the at least one controller is further configured to:

determine a phase of free induction decay during the readout period;

fit the determined phase to a linear model; and reconstruct the at least one image based, at least in part, on the fit phase to correct image blurring due to drift in the main magnetic field $B_0$.

7. The low-field MRI system of claim 1, wherein the diffusion-weighted gradient encoding period includes a diffusion-weighted gradient pulse with asymmetrical attack and decay edges such that the diffusion-weighted gradient pulse is not trapezoidal shaped.

8. The low-field MRI system of claim 7, wherein the attack edge of the diffusion-weighted gradient pulse has a slope that varies.

9. The low-field MRI system of claim 1, wherein the multiple echo periods includes a first echo period during which a first encoded echo has a first gradient polarity and a second echo period immediately following the first echo period during which a second encoded echo has a second encoded echo having a second gradient polarity opposite the first gradient polarity, the at least one pulse sequence further comprises an RF pulse followed by a readout period, wherein the readout period overlaps in time with the diffusion-weighted gradient encoding period, and the diffusion-weighted gradient encoding period includes a diffusion-weighted gradient pulse with asymmetrical attack and decay edges such that the diffusion-weighted gradient pulse is not trapezoidal shaped, wherein the attack edge of the diffusion-weighted gradient pulse has a slope that varies.

10. The low-field MRI system of claim 9, wherein the at least one controller is further configured to:

reconstruct a first plurality of images based, at least in part, on the magnetic resonance signals detected during the first echo period;

reconstruct a second plurality of images based, at least in part, on the magnetic signals detected during the second echo period;

de-warp the first plurality of images and the second plurality of images;

combine the de-warped first plurality of images and the second plurality of images to produce combined images;

determine a phase of free induction decay during the readout period;

fit the determined phase to a linear model; and reconstruct at least one image based, at least in part, on the fit phase and the combined images.

11. The low-field MRI system of claim 1, wherein the $B_0$ magnet is configured to produce a $B_0$ field having a strength equal to or less than approximately 0.2 T and greater than or equal to approximately 0.1 T.

12. The low-field MRI system of claim 1, wherein the $B_0$ magnet is configured to produce a $B_0$ field having a strength equal to or less than approximately 0.1 T and greater than or equal to approximately 50 mT.

13. The low-field MRI system of claim 1, wherein the $B_0$ magnet is configured to produce a $B_0$ field having a strength equal to or less than approximately 50 mT and greater than or equal to approximately 20 mT.

14. The low-field MRI system of claim 1, wherein the $B_0$ magnet is configured to produce a $B_0$ field having a strength equal to or less than approximately 20 mT and greater than or equal to approximately 10 mT.

15. A computer-implemented method of operating a low-field magnetic resonance imaging (MRI) system to perform diffusion weighted imaging, the low-field MRI system including a plurality of magnetics components including a $B_0$ magnet configured to produce a low-field main magnetic field $B_0$, at least one gradient coil configured to, when operated, provide spatial encoding of emitted magnetic resonance signals, and at least one radio frequency (RF) component configured to acquire, when operated, the emitted magnetic resonance signals, the method comprising:

controlling one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

16. The computer-implemented method of claim 15, wherein the multiple echo periods includes a first echo period during which a first encoded echo has a first gradient polarity and a second echo period immediately following the first echo period during which a second encoded echo has a second encoded echo having a second gradient polarity opposite the first gradient polarity, and wherein the method further comprises:

reconstructing a first plurality of images based, at least in part, on the magnetic resonance signals detected during the first echo period;

reconstructing a second plurality of images based, at least in part, on the magnetic signals detected during the second echo period;

de-warping the first plurality of images and the second plurality of images; and combining the de-warped first plurality of images and the second plurality of images to reconstruct at least one image.

17. The computer-implemented method of claim 15, wherein the at least one pulse sequence further comprises an RF pulse followed by a readout period, wherein the readout period overlaps in time with the diffusion-weighted gradient encoding period, and wherein the method further comprises:

determining a phase of free induction decay during the readout period;

fitting the determined phase to a linear model; and reconstructing at least one image based, at least in part, on the fit phase to correct image blurring due to drift in the main magnetic field $B_0$.

18. The computer-implemented method of claim 15, wherein the diffusion-weighted gradient encoding period includes a diffusion-weighted gradient pulse with an attack edge having a slope that varies.

19. A non-transitory computer-readable medium encoded with a plurality of instructions that, when executed by at least one computer processor, cause the at least one computer processor to perform a method of operating a low-field magnetic resonance imaging (MRI) system to perform diffusion weighted imaging, the low-field MRI system including a plurality of magnetics components including a $B_0$ magnet configured to produce a low-field main magnetic field $B_0$, at least one gradient coil configured to, when operated, provide spatial encoding of emitted magnetic resonance signals, and at least one radio frequency (RF) component configured to acquire, when operated, the emitted magnetic resonance signals, the method comprising:

controlling one or more of the plurality of magnetics components in accordance with at least one pulse sequence having a diffusion-weighted gradient encoding period followed by multiple echo periods during which magnetic resonance signals are produced and detected, wherein at least two of the multiple echo periods correspond to respective encoded echoes having an opposite gradient polarity.

20. The non-transitory computer-readable medium of claim 19, wherein the multiple echo periods includes a first echo period during which a first encoded echo has a first gradient polarity and a second echo period immediately following the first echo period during which a second encoded echo has a second encoded echo having a second gradient polarity opposite the first gradient polarity, and wherein the method further comprises:

reconstructing a first plurality of images based, at least in part, on the magnetic resonance signals detected during the first echo period;

reconstructing a second plurality of images based, at least in part, on the magnetic signals detected during the second echo period;

de-warping the first plurality of images and the second plurality of images; and combining the de-warped first plurality of images and the second plurality of images to reconstruct at least one image.

* * * * *